US006587408B1

(12) United States Patent
Jacobson et al.

(10) Patent No.: US 6,587,408 B1
(45) Date of Patent: Jul. 1, 2003

(54) HIGH-DENSITY MECHANICAL MEMORY AND TURING MACHINE

(75) Inventors: Joseph M. Jacobson, Newton, MA (US); Brian N. Hubert, Cambridge, MA (US); Brent Ridley, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/409,188

(22) Filed: Sep. 30, 1999

Related U.S. Application Data

(60) Provisional application No. 60/102,689, filed on Oct. 1, 1998.

(51) Int. Cl.[7] .............................................. G11B 7/00
(52) U.S. Cl. .............................. 369/44.16; 369/44.14; 369/44.15; 250/442.11
(58) Field of Search ........ 250/442.11; 369/44.14–44.16

(56) References Cited

U.S. PATENT DOCUMENTS

| | | | | |
|---|---|---|---|---|
| 5,557,596 A | * | 9/1996 | Gibson et al. ............... | 369/101 |
| 5,587,223 A | * | 12/1996 | White ......................... | 428/195 |
| 5,796,706 A | * | 8/1998 | Shintani et al. ............. | 369/126 |
| 5,801,472 A | * | 9/1998 | Wada et al. ................ | 310/309 |
| 5,956,216 A | * | 9/1999 | Chou ......................... | 360/131 |
| 6,252,226 B1 | * | 6/2001 | Kley .......................... | 250/306 |
| 6,300,622 B1 | * | 10/2001 | Menzel ....................... | 250/234 |
| 6,309,798 B1 | * | 10/2001 | Reetz et al. ................ | 430/296 |
| 6,310,342 B1 | * | 10/2001 | Braunstein et al. ......... | 250/306 |
| 6,355,491 B1 | * | 3/2002 | Zhou et al. ................. | 436/518 |

OTHER PUBLICATIONS

G Lingjie, E Leobandung, and SY Chou, "A room–temperature silicon single–electron metal–oxide–semiconductor memory with nanoscale floating–gate and ul–tranarrow channel", Appl. Phys. Lett., vol. 70, No. 7, Feb. 17, 1997, pp. 850–852.

L Zhuang, L Guo, and SY Chou, "Silicon single–electron quantum–dot transistor switch operating at room temperature", Appl. Phys. Lett., vol. 72, No. 10, Mar. 9, 1998, pp 1205–1207.

G Lingjie, E Leobandung, L Zhuang, and SY Chou, "Fabrication and characteri–zation of room temperature silicon single electron memory", AIP for American Vacuum Soc. Journal of Vacuum Science & Technology B, vol. 15, No. 6, Nov.–Dec. 1997, pp. 2840–2843.

K Yano, T Ishii, T Sane, T Mine, F Murai, T Kure, and K Seki, "A 128 Mb early prototype of gigascale single–electron memories", 1998 IEEE International Solid–Sate Circuits Conference, Digest of Technical Papers, ISSCC, 1st Ed, IEEE, 1998, pp 244–245, 462.

T Ishii, K Yano, T Sano, T Mine, F Murai, and K Seki, "Verify: key to the stable single–electron–memory", International Electron Devices Meeting 1997, IEDM Technical Digest, IEEE, pp 171–174.

(List continued on next page.)

*Primary Examiner*—David Hudspeth
*Assistant Examiner*—Dan I. Davidson
(74) *Attorney, Agent, or Firm*—Testa, Hurwitz & Thibeault, LLP

(57) ABSTRACT

Micron-scale, self-contained, ultra-high density and ultra-high speed storage devices include a read/write head and a surface, containing bit-storage domains, that acts as the storage medium. The read/write element of the memory device may consist of a single or multiple heads. The read/write head may be mounted on microelectromechanical structures driven at mechanical resonance. Addressing of individual bits is accomplished by positioning of the head element in close proximity to bit domains situated on the storage medium.

28 Claims, 14 Drawing Sheets

OTHER PUBLICATIONS

K Yano, T Ishii, T Sano, T Mine, F Murai, and K Seki, "Single–electron–memory integrated circuit for giga–to–tera bit storage", Silicon Nanoelectronics Workshop 1997, workshop absracts, Univ. Tokyo, 1997, pp 22–23.

A Nakajima, T Futatsugi, K Kosemura, T Fukano, and N Yokoyama, "Room temperature operation of Si single–electron memory with self–aligned floating dot gate", International Electron Devices Meeting. Technical Digest (Cat. No.96CH35961). IEEE. 1996, pp. 952–954.

S Tiwari, JJ Welser, and F Rana, "Technology and power–speed trade–offs in quantum–dot and nano–crystal memory devices", 1997 Symposium on VLSI Technology, Digest of Technical Papers (IEEE Cat. No. 97CH36114). Japan Soc. Appl. Phys. 1997, pp. 133–134.

P Bhyrappa, SR Wilson, KS Suslick, "Hydrogen–bonded porphyrinic solids: su–pramolecular networks of octahydroxy porphyrins", Journal of the American Chemical Society, 119: (36) 8492–8502, Sep. 10, 1997.

H Zollinger, Color Chemistry Second, revised edition, 1991, Verlagsgesellschaft, Weinheim, pp. 353–360.

CB Murray, CR Kagan, and MG Bawendi, "Self–organization of CdSe nanocrys–tallites into three–dimensional quantum dot superlattices", Science, vol. 270, Nov. 24, 1995, pp. 1335–1338.

BD Terris, HJ Mamin, and D Rugar, "Near–field optical data storage using a solid immersion lens", Appl. Phys. Lett., vol. 65, No. 4, Jul. 25, 1994, pp 388–390.

G Markovich, DV Leff, S–W Chung, HM Soyez, B Dunn, and JR Heath, "Parallel fabrication and single–electron charging of devices based on ordered, two–dimensional phases of organically functionalized metal nanocrystals", Appl. Phys. Lett., vol. 70 (23), Jun. 9, 1997, pp. 3107–3109.

MJ Yoo, TA Fulton, HF Hess, RL Willett, LN Dunkleberger, RJ Chichester, LN Pfeiffer, and KW West, "Scanning single–electron transistor microscopy: Imaging individual charges", Science Magazine, vol. 276, Apr. 25, 1997, pp. 579–582.

RJ Schoelkopf, P Wahlgren, AA Kozhevnikov, "The radio–frequency single–electron transistor (RF–SET): A fast and ultrasensitive electrometer", Science Magazine, vol. 280, May 22, 1998, pp. 1238–1242.

K Shum, J. Zhou, W Zhang, L Zeng, and MC Tamargo, "A concept for nonvola–tile memories", Appl. Phys. Lett., vol. 71, No. 17 Oct. 27, 1997, pp 2487–2489.

SC Minne, G Yaralioglu, ST Manalis, JD Adams, J Zesch, A Atalar, and CF Quate, "Automated parallel high–speed atomic force microscopy", Appl. Phys. Lett., vol. 72, No. 18, May 4, 1998, pp. 2340–2342.

ES Snow, PM Campbell, RW Rendell, FA Buot, D Park, DRK Marrian, and R Magno, "A metal/oxide tunneling transistor", Appl. Phys. Lett., vol. 72, No. 23, Jun. 8, 1998, pp. 3071–3073.

BD Terris and RC Barrett, "Data Sorage in NOS: Lifetime and carrier–to–noise measurements", IEEE Transactions on Electron Devices, vol. 42, No. 5, May 1995, pp. 944–949.

K Matsumoto, M Ishii, K Segawa, Y Oka, BJ Vartanian, and JS Harris, "Room temperature operation of a single electron transistor made by the scanning tun–neling microscope nanooxidation process for the TiOx/Ti system", Appl. Phys. Lett., vol. 68, No. 1 Jan. 1, 1996, pp. 34–36.

JH Mamin, BD Terris, LS Fan, S Hoen, RC Barrett, and D Rugar, "High–density data storage using proximal probe techniques", IBM Journal of Research and De–velopment, vol. 39, No. 6, Nov. 1995, pp. 681–699.

K Lafdi, A Chin, N Ali, and JF Despres, "Cobalt–doped carbon nanotubes: prepa–ration, texture, and magnetic properties", J. Appl. Phys. 79 (8), Apr. 15, 1996, pp 6007–6008.

J Meier, B Doudin, and J–Ph Ansermet, "Magnetic properties of nanosized wires", J. Appl. Phys. 79 (8), Apr. 15, 1996, pp 6010–6012.

A Tayaoka, E Tayaoka, and J Yamasaki, "Preparation of Co–Fe–P amorphous fine needles with anodization technique and measurement of demagnetizing factor", J. Appl. Phys. 79 (8), Apr. 15, 1996, pp 6016–6018.

RJ Celotta, R Gupta, RE Scholten, and JJ McClelland, "Nanostructure fabrication via laser–focused atomic deposition", , J. Appl. Phys. 79 (8), Apr. 15, 1996, pp 6079–6083.

JJ Krebs, W Vavra, and GA Prinz, "Perpendicular transport and magnetic proper–ties in patterned multilayer magnetic microstructures", J. Appl. Phys. 79 (8), Apr. 15, 1996, pp 6084–6089.

B Doudin, A Blondel, and J–Ph Ansermet, "Arrays of multilayered nanowires", J. Appl. Phys. 79 (8), Apr. 15, 1996, pp 6090–6094.

S Gadetsky, JK Erwin, M Mansuripur, and T Suzuki, "Magneto–optical recording on patterned substrates", J. Appl. Phys. 79 (8), Apr. 15, 1996, pp 5687–5692.

K Bessho, Y Iwasaki, and S Hashimoto, "Fabricating nanoscale magnetic mounds using a scanning probe microscope", J. Appl. Phys. 79 (8), Apr. 15, 1996, pp 5057–5059.

DL Leslie–Pelecky, "Self–stabilized magnetic colloids: Ultrafine Co particles in polymers", J. Appl. Phys. 79 (8), Apr. 15, 1996, pp 5312–5314.

D Johnson, P Perara, and O'Shea, "Finite size effects in nanoscale Tb particles", J. Appl. Phys. 79 (8), Apr. 15, 1996, pp 5299–5301.

R O'Barr, M Lederman, S Schultz, W Xu, A Scherer, RJ Tonucci, "Preparation and quantitative magnetic studies of single–domain nickel cylinders", J. Appl. Phys. 79 (8), Apr. 15, 1996, pp 5305–5305.

J Levy, V Nikitin, JM Kikkawa, DD Awschalom, and N Smarth, "Femtosecond near–field spin microscopy in digital magnetic heterostructures", J. Appl. Phys. 79 (8), Apr. 15, 1996, pp 6095–100.

SY Chou and PR Krauss. "65 Gbits/in2 quantum magnetic disk (abstract)", J. Appl. Phys. 79 (8), Apr. 15, 1996, pp 5066.

U Suriono and SY Chou, "Quantized writing processes in quantum magnetic disk (abstract)", J. Appl. Phys. 79 (8), Apr. 15, 1996, pp 5066.

SY Chou, PR Krauss, and L Kong, "Nanolithographically defined magnetic structures and quantum magnetic disk", J. Appl. Phys. 79 (8), Apr. 15, 1996, pp 6101–6106.

AP Alivistos, "Electrical Studies of Semiconductor–Nanocrystal Colloids," MRS Bulletin, Feb. 1998, pp 18–23.

Y Xia, G Whitesides, "Soft Lithography," Angew. Chem. Int. Ed., 37, pp 551–564, 1998.

J Cortes Rosa, M Wendel, H. Lorenz, JP Kotthaus, M Thomas, H Kroemer, "Di–rect Patterning of Surface Quantum Wells With an Atomic Force Microscope," Applied Physics Letters, vol. 73, No. 18, Nov. 2, 1998.

Angew. Chem. Int. Ed., 37, pp. 565–573, 1998.

* cited by examiner

SECTION A - A

SECTION A - A

| CURRENT STATE | READ | WRITE | MOVE | NEW STATE |
|---|---|---|---|---|
| START | 1 | 1 | RIGHT | 0 |
| 0 | 0 | 1 | RIGHT | 1 |
| 0 | 1 | 1 | RIGHT | 0 |
| 1 | 0 | 0 | LEFT | 2 |
| 1 | 1 | 1 | RIGHT | 1 |
| 2 | 0 | 0 | LEFT | 2 |
| 2 | 1 | 0 | LEFT | 3 |
| 3 | 0 | 0 | RIGHT | STOP |
| 3 | 1 | 1 | LEFT | 3 |

FIG. 8A

| CURRENT STATE | BIT STRING | | | | | | | NEW STATE |
|---|---|---|---|---|---|---|---|---|
| START | 0 | *1* | 1 | 0 | 1 | 1 | 0 | 0 |
| 0 | 0 | 1 | *1* | 0 | 1 | 1 | 0 | 0 |
| 0 | 0 | 1 | 1 | *1* | 1 | 1 | 0 | 1 |
| 1 | 0 | 1 | 1 | 1 | *1* | 1 | 0 | 1 |
| 1 | 0 | 1 | 1 | 1 | 1 | *1* | 0 | 1 |
| 1 | 0 | 1 | 1 | 1 | 1 | 1 | *0* | 2 |
| 2 | 0 | 1 | 1 | 1 | 1 | *0* | 0 | 3 |
| 3 | 0 | 1 | 1 | 1 | *1* | 0 | 0 | 3 |
| 3 | 0 | 1 | 1 | *1* | 1 | 0 | 0 | 3 |
| 3 | 0 | 1 | *1* | 1 | 1 | 0 | 0 | 3 |
| 3 | 0 | *1* | 1 | 1 | 1 | 0 | 0 | 3 |
| 3 | *0* | 1 | 1 | 1 | 1 | 0 | 0 | STOP |

FIG. 8B

HIGH-DENSITY MECHANICAL MEMORY AND TURING MACHINE

RELATED APPLICATION

The present application stems from U.S. Provisional Application Ser. No. 60/102,689, filed on Oct. 1, 1998.

FIELD OF THE INVENTION

The present invention relates generally to non-volatile data storage devices, and more particularly to non-volatile data storage devices that exhibit ultra-high bit densities and very high data transfer rates. Additionally, the present invention relates to the cooperation between microelectromechanical (MEM) elements and nano-scale patterned surfaces.

BACKGROUND OF THE INVENTION

Currently, there are increasing demands for non-volatile data-storage devices with higher bit density, faster speed, lower power consumption, smaller size, and lower weight than presently available state-of-the-art devices. As a result, enormous research efforts have been devoted to the study and control of key factors that will lead to the necessary technical advances. CMR (colossal magneto-resistive) and GMR (giant magneto-resistive) effects have been exploited in thin-film ferromagnetic memory technologies, such as those found in computer hard drives. Unfortunately, implementations of this memory technology require large and bulky disk-drive mechanisms with complicated moving parts.

Proximal-probe techniques such as AFM (atomic force microscopy), MFM (magnetic force microscopy), SPM (scanning probe microscopy), thermomechanical writing, and many others have also been proposed for ultra-high density memory devices, but few of these efforts have yielded practical implementations.

Chip-based non-volatile devices such as ferroelectric memories, EPROMs (eraseable programmable read-only memories), and EEPROMs (electronically erasable programmable read-only memories) generally suffer from high manufacturing costs. Most critically, bit densities are severely limited by the size of the transistors used to write and read the digital information stored in each memory cell. However, chip-based memories enjoy the advantages of a complete write and read system contained in a single device with no moving parts.

Accordingly, there exists a distinct need for a non-volatile memory device that can combine the integral read/write capabilities and small size of chip-based memories with the ultra-high bit density capabilities of proximal-probe techniques.

DESCRIPTION OF THE INVENTION

Brief Summary of the Invention

In accordance with the present invention, a micron-scale, self-contained, ultra-high density and ultra-high speed storage device that is both re-writeable and non-volatile comprises two primary complementary components: a read/write head and a surface, containing bit-storage domains, that acts as the storage medium. The read/write element of the memory device may include a single or multiple heads mounted, for example, on microelectromechanic structures (MEMS) driven at mechanical resonance. Addressing of individual bits is accomplished by positioning the head element in close proximity to bit domains situated on the storage medium.

In one embodiment, individual bit domains are formed by nanoprinting. In a second embodiment, bit domains are formed by self-assembling metal-organic structures. In a third embodiment, a continuous electronically writeable film is created.

X-Y translation of a read/write head may be accomplished by vibrating motion in cross-mounted MEM structures. Alternatively, the read/write head may be fixed to a stationary support, with the memory medium attached to a MEM translation structure.

In another aspect of the invention, storage devices in accordance herewith are employed as universal Turing machines.

BRIEF DESCRIPTION OF THE DRAWINGS

The foregoing discussion will be understood more readily from the following detailed description of the invention, when taken in conjunction with the accompanying drawings, in which:

FIG. 8A is a table of instructions for a simple Turing machine that can perform unary addition;

FIG. 8B is the complete unary addition operation dictated by the instruction set shown in FIG. 8A.

DETAILED DESCRIPTION OF THE PREFERRED EMBODIMENTS

Figure 1:
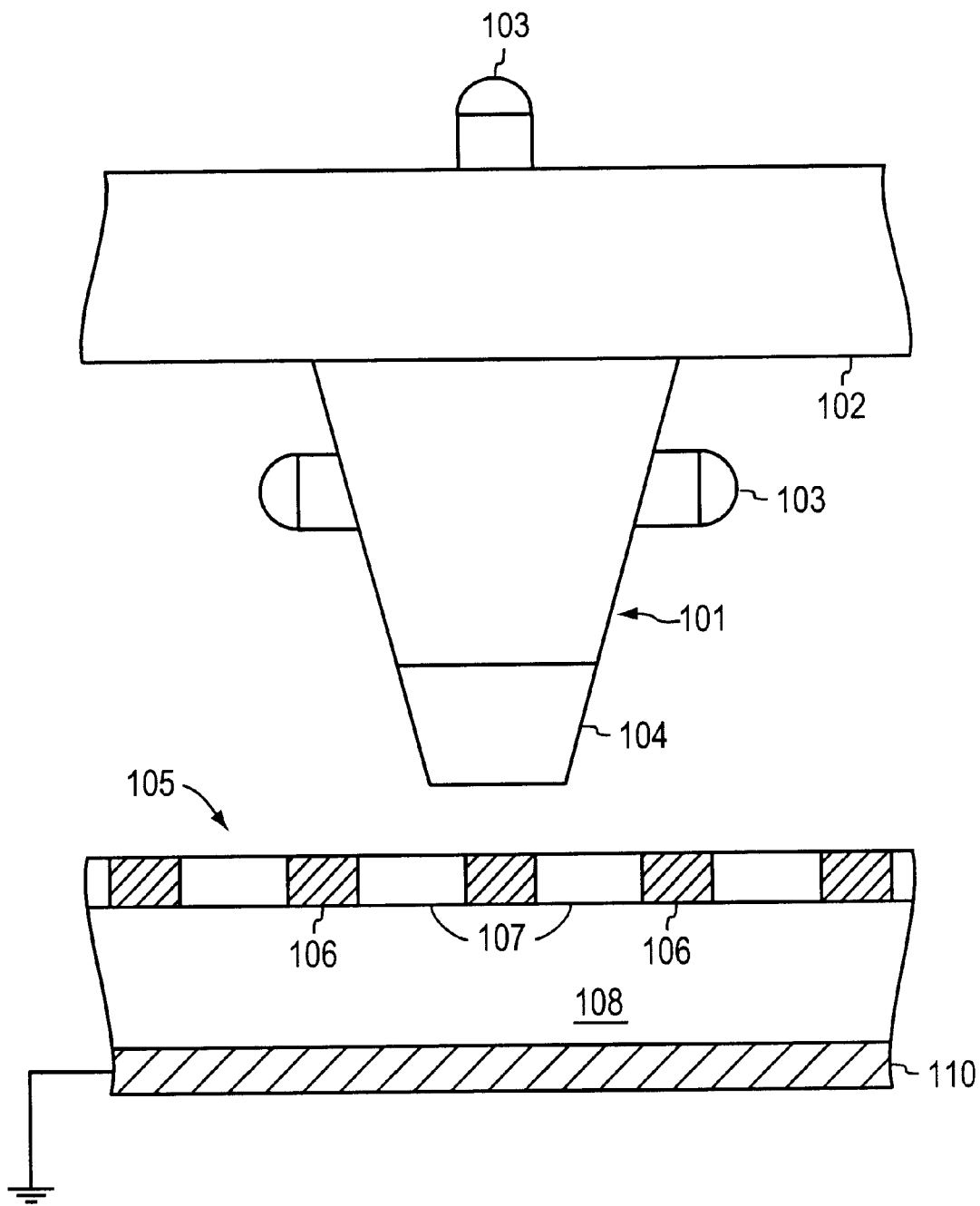
FIG. 1 is an elevation of a memory read and/or write head and a memory medium in accordance with the present invention.

With reference to FIG. 1, a micron- or nanometer-scale probe 101 is attached to a support structure 102. A memory read and/or write head 104 is situated at the tip of probe 101 in very close proximity to a memory medium 105. This memory medium is typically bonded to a support 108 (which maybe fabricated from any application-appropriate material having a sufficiently glossy surface, e.g., glass, a plastic (e.g., MYLAR) film, high-density polyethylene, or even glossy paper) and may be patterned at the point of manufacture with an array of bit-storage domains representatively indicated at 106, which are spaced at regular intervals. Storage domains 106 may exhibit magnetic, ferroelectric, charge-trapping, or phase-change properties that manifest a discernible change of state when subjected to a magnetic, electromagnetic, electric, or thermal field emanating from head 104. Domains 106 are separated from one another by inactive regions representatively indicated at 107, which do not manifest a response to head 104. Bit information, therefore, cannot be stored in inactive regions 107. A conductive groundplane 110 underlies support 108.

Alternatively, the memory medium 105 may be relatively homogeneous so that bit information can be stored anywhere across its surface. In this case, precisely controlled relative translation between head 104 and memory medium 105 allows head 104 to selectively store bit information only in certain predetermined regions 106 and not in regions 107.

Retrieval of bits requires relative movement between a read head (the functions of which may be implemented by head 104 or by a separate head) and memory medium 105 so as to place the read head proximate to a memory location to be interrogated. In one implementation, memory-medium support structure 108 translates, while probe support structure 102 remains stationary. In another implementation, memory-medium support structure 108 remains stationary, while probe support structure 102 translates. In yet another implementation, both support structures 102, 108 translate relative to some fixed reference frame. In any of these implementations, the support structures 102, 108 cooperate so that read and/or write head 104 and memory medium 105 are in close proximity and can interact over a planar area of modest size. However, if data input/output and power lines are connected to head 104, by way of probe 101 and support structure 102, it is advantageous to adopt a configuration in which memory-medium support structure 108 translates, while probe support structure 102 remains stationary.

Data input/output lines to head 104 may be replaced by a series of photodiodes 103, which communicate wirelessly with an appropriate detector. These diodes may be LEDs or laser diodes, and the structures 103, which are operated by an external computer, may include a detector to facilitate two-way data transfer between the computer and head 104. If multiple heads are mounted on support structure 102, the diode transceivers can pass data back and forth between the heads (as well as the external computer) to facilitate efficient bit-shuffling operations.

Figure 2A:
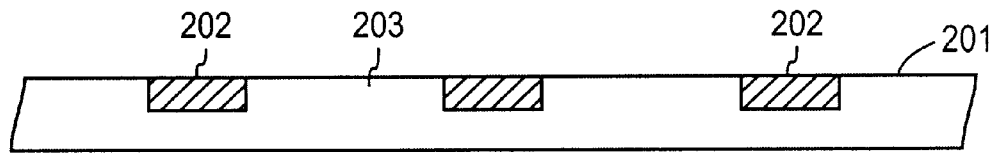
FIG. 2A is an elevation showing a series of bit-storage domains located at and/or below the surface of a memory medium.
Figure 2B:
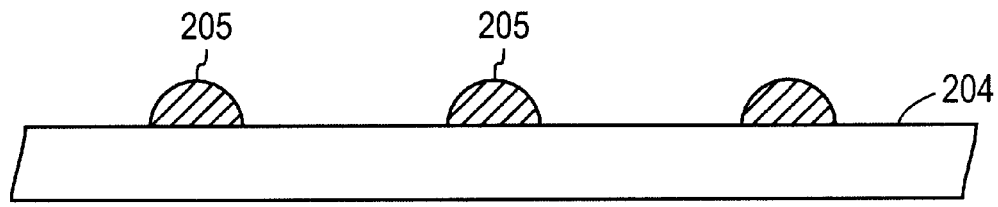
FIG. 2B is an elevation showing a series of bit-storage domains located on the surface of a memory medium.
Figure 2C:
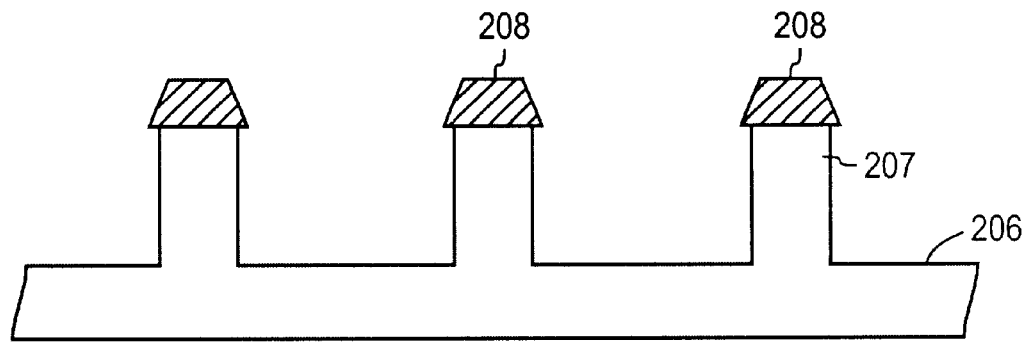
FIG. 2C is an elevation showing a series of bit-storage domains located on the tips of pillars formed into the surface of a memory medium.

The material of memory medium 105 may be a homogeneous or heterogeneous, ordered or unordered, patterned or unpatterned film whose local long-term magnetic field state, electric field state, electrical resistance, and/or material phase can manipulated by external magnetic, electric, electromagnetic, or thermal fields applied by a write head. As shown in FIG. 2A, the bit-storage domains 202 of a memory medium 201 may be insulated from one another by intervening regions, indicated generally at 203, where bit information cannot be stored. Bit-storage domains 202 may be located, as illustrated, at and/or below the surface of memory medium 201. However, as shown in FIG. 2B, bit-storage domains 205 may instead be located atop the surface of a memory medium 204; and as shown in FIG. 2C, bit-storage domains 208 may lie on the tips of nano-scale pillars 207 projecting from the surface of the memory medium 206. Maximum bit density is achieved by limiting storage domains to approximately 10 to 50 nm in size spaced at regular intervals of 40 to 120 nm. In one scheme, the memory medium is an insulating film onto which nano-patterned metal has been deposited so that one or more electrons can be stored on the metallic islands. Such patterning may be accomplished using conventional techniques such as photo or e-beam or ion-beam lithography, nano-imprint lithography, or microcontact printing. Alternatively, the metallic islands may be ferromagnetic (e.g., cobalt or iron), each island representing a nanometer-scale magnetic domain. See, e.g., Leslie-Pelecky et al., *J. Appl. Phys.* 79:5312–5314 (1996); Chou et al., *J. Appl. Phys.* 79:6101–6106 (1996).

Figure 2D:
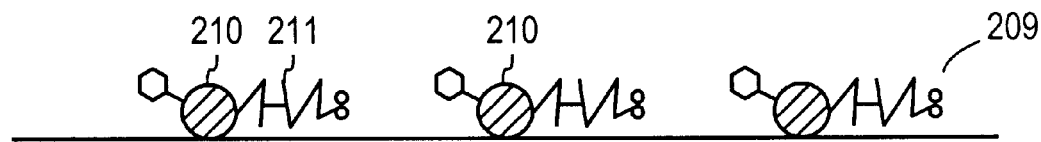
FIG. 2D is a partially schematic side view of a memory medium composed of physically separated nanoparticles as the bit-storage domains.

FIG. 2D illustrates a memory medium 209 comprising a film of charge-trapping nanoparticles 210 separated by a binder, polymer, carrier, air, or intervening capping groups indicated at 211. The term "nanoparticles" herein refers to particles ranging in size from nearly 1 nm to 999 nm, and these can be unordered or can be ordered though self-assembly (see, e.g., Murray et al., *Science* 270:1335–1338 (1995)). Charge-trapping nanoparticles may be metal (e.g., gold or silver) or semiconductive (e.g., silicon, cadmium selenide) in composition.

In another approach, memory medium 209 is an amorphous material that exhibits glassy semiconducting switching. For example, the memory medium may be a film of chalcogenide glass capable of non-volatile Ovonic memory switching (e.g., an Ovshinshky memory switch film with formula $Te_{81}Ge_{15}X_4$, where X is an element from Group V or Group VI of the periodic table). Materials based on germanium telluride are allotropic and have an ordered phase (conducting) and a disordered phase (resistive). In essence, switching behavior in these materials is based on reversible phase changes that occur when electrical pulses of various durations are applied by the write head. A conductive 'ON' state is created by a relatively long electrical pulse which triggers the formation of crystalline filaments between the an external electrode and support 108, which in this case is conductive. A very short electrical pulse induces local heating with rapid cooling which destroys the crystallinity, producing a nonconductive 'OFF' state.

In still another approach, the memory medium is another amorphous material that exhibits memory action—i.e., hysteretic retention of a readable state. For example, the memory film may be a metal-oxide or semiconductor-oxide memory film (e.g., based on $Nb_2O_5$, SiO, or $TiO_2$). In yet another approach, the memory medium is a metal-in-polymer or semiconductor-in-polymer matrix exhibiting reversible switching behavior (between conductive and nonconductive states) when subjected to electrical pulses of opposite polarity. Materials suitable for this approach, as well as techniques for setting and reading memory states, are described in copending application Ser. No. 09/291,801, filed on Apr. 14, 1999 (the entire disclosure of which is hereby incorporated by reference). Films based on such matrix materials can be deposited onto suitable substrates using conventional processes like screen printing, block printing, painting, and the like.

Figure 2E:
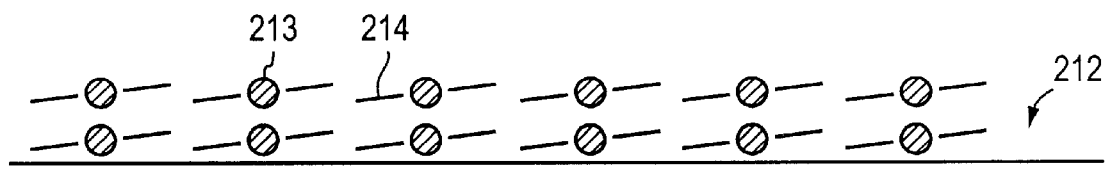
FIG. 2E schematically depicts a memory medium composed of metal-organic molecules with bit-storage domains occupying some portion of each molecule.
Figure 2F:
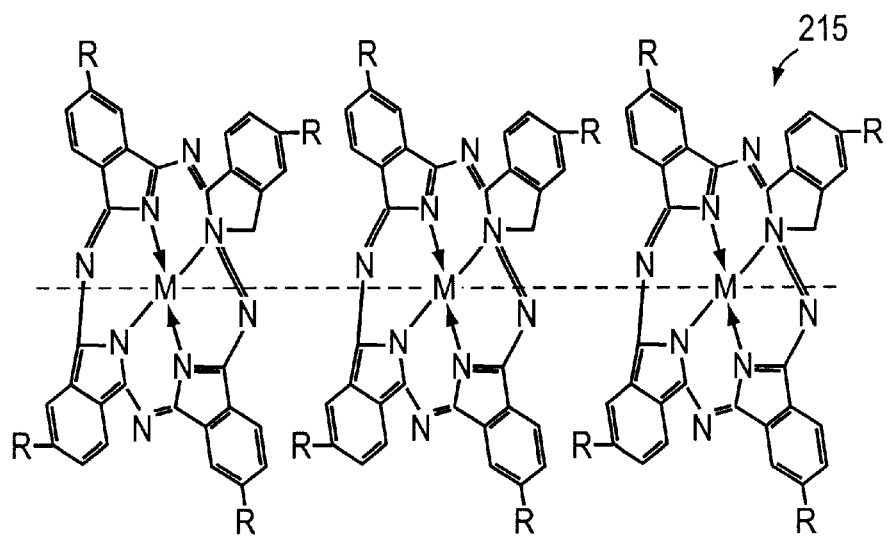
FIG. 2F illustrates an example of planar metal-organic molecules, specifically metal-phthalocyanines, for use in the memory medium shown in FIG. 2E.
Figure 2G:
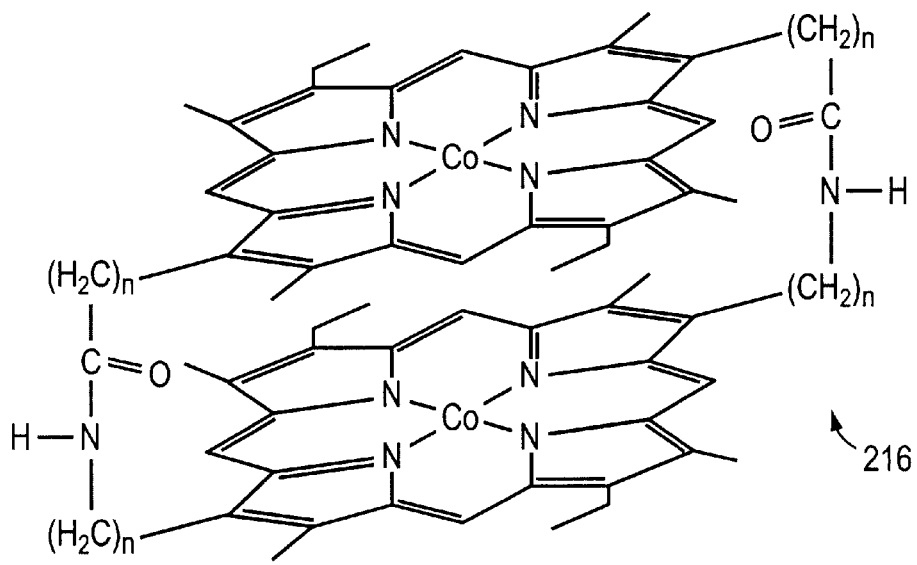
FIG. 2G illustrates a particular metal-phthalocyanine complex.

FIG. 2E illustrates the use of the metal centers of porphyrin, phthalocyanine, or a similar metal-organic material as the site for charge retention. Charge is retained in such systems by virtue of delocalization across a conjugated organic system. The stored charge may be further delocalized by utilizing a stack of such metal-organic materials; in this way, charge is delocalized in three, rather than two dimensions. In FIG. 2E the memory medium 212 appears as a series of conducting islands 213 (each representing a coordination complex of a metal atom surrounded by one or more organic ligands), the islands 213 being separated from each other by an insulator 214 (e.g., side chains of the ligands that may aid in processing and self-assembly). For example, two-dimensional sheets of phthalocyanines in which the monomeric ring systems lie in the same plane can be synthesized by known methods. Such sheets may include side chains (such as amine and carboxylic acid groups) that promote self-assembly, bond to adjacent ring systems, and/ or improve insulation between stacks. FIG. 2F shows the general structure of phthalocyanines (M referring to the metal atom, and R to an alkyl, aryl, or aryl-alkyl substituent, the identities of M and R being straightforwardly selected by those of skill in the art without undue experimentation). In the illustration, the stacking of metal-organic complexes is illustrated by the stacking of phthalocyanine units 215 and the co-planarity of adjacent, bound metal-organic rings. Parallel stacking among these rings can be maintained by linked side chains as illustrated by the cobalt-porphyrin complex 216 in FIG. 2G.

The different oxidation states of organic or organometallic compounds can also be used for reversible bit storage, with the different oxidation states corresponding to different memory states. An exemplary molecular system well-suited to this approach is the metallophthalocyanine family. The 1:2 lutetium:phthalocyanine complex, for example, has four oxidation states (see H. Zollinger, Color Chemistry (1991)) that may be reversibly addressed by means of an applied voltage. In particular, the change in oxidation state results in a detectable change in electron tunneling probability. This change can be detected with, for example, a scanning tunneling microscope (which uses a voltage bias applied to a tip relative to the memory medium).

Still another organic system useful for reversible bit storage is exemplified by bacteriorhodopsin, which undergoes a reversible structural or conformational change upon the application of a voltage. This physical change is not necessarily accompanied by a change in oxidation state. The rearranged physical structure or conformational change is detectable by "feeling" the changed structure with an atomic force microscope or, depending on the system, by probing for conductivity changes.

Figure 3A:
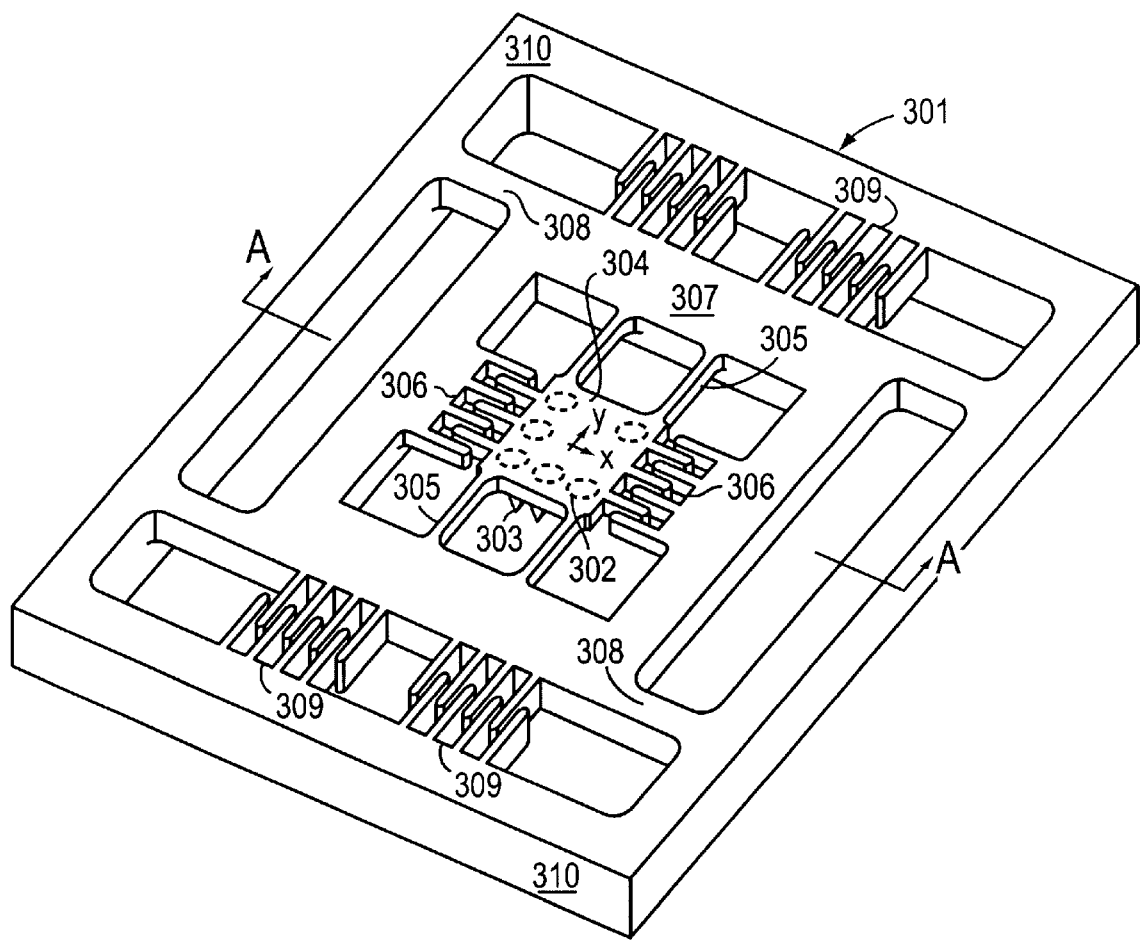
FIG. 3A is an isometric view of a micron-scale two-axis positioning support gantry.
Figure 3B:
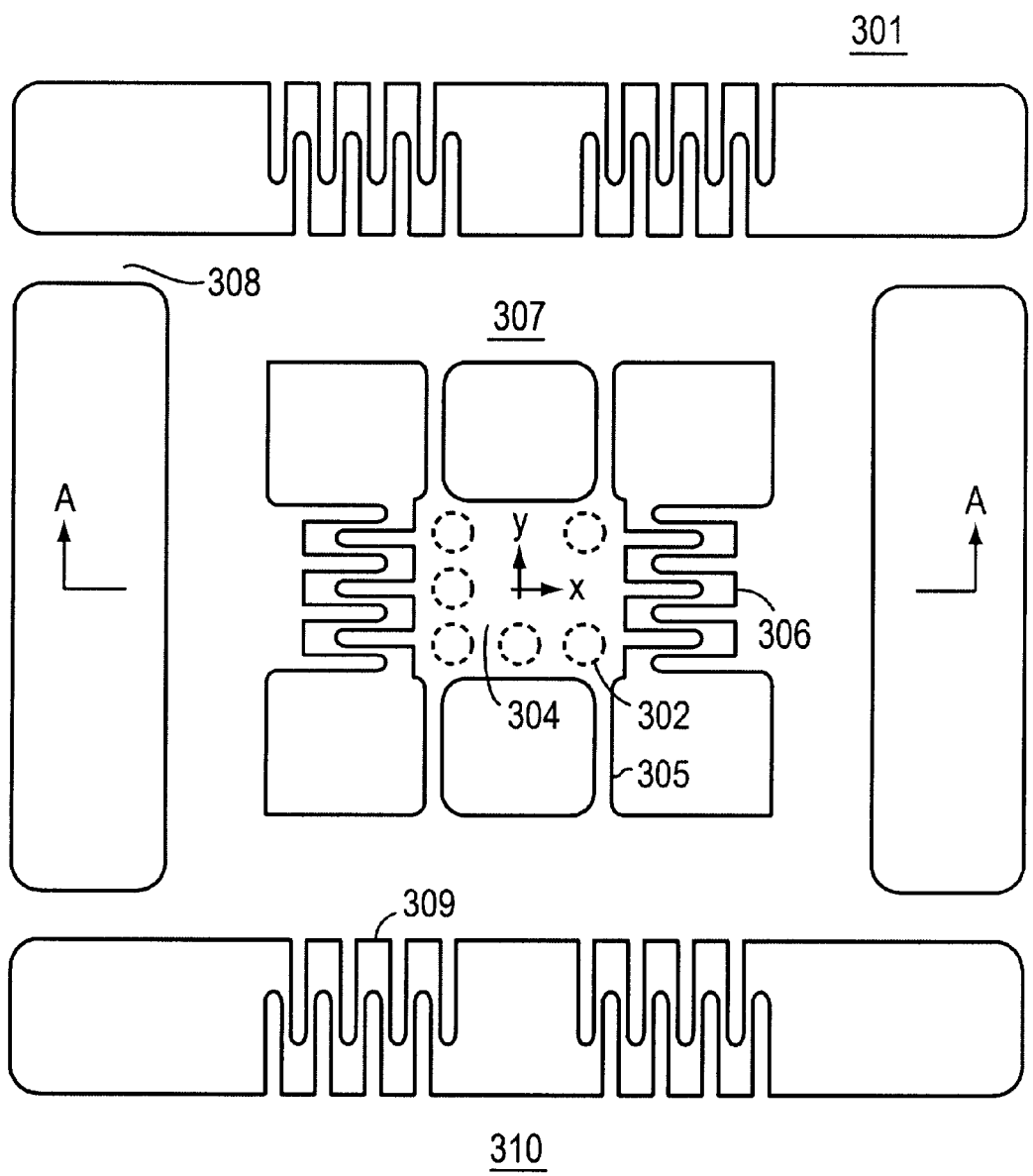
FIG. 3B is a plan view of the positioning support gantry shown in FIG. 3A.

FIGS. 3A and 3B illustrate a micrometer-scale two-axis positioning gantry, indicated generally at 301, that can be used to cause planar (X-Y) translation of either a storage medium or read and/or write head(s) relative to a fixed reference frame. Due to the maturity of silicon-based lithographic and etching technologies, it is desirable that gantry 301 be composed of silicon and/or silicon-based compounds and be manufactured using technologies regularly employed in the manufacture of MEM devices. The perimeter of gantry 301 is composed of a square frame 310 having dimensions on the order of 1000 to 3000 $\mu$m on a side with a thickness of 100 to 300 $\mu$m. A translation platform 307 is flexibly attached to frame 310 by way of four flexible beams 308. The center of gantry 301 is indicated by an X-Y origin point, and using this origin as a reference, it can be seen that two pairs of symmetrically placed electrostatic comb drives 309 can cause lateral flexure of beams 308, thereby causing platform 307 to translate in the Y-direction. In general, translation platform 307 may have external dimensions of approximately 500×350×75 $\mu$m.

A second, smaller translation platform 304 is flexibly attached to Y-translation platform 307 by way of four flexible beams 305. A pair of symmetrically placed electrostatic comb drives 306 cause lateral flexure of beams 305, thereby causing platform 304 to translate in the X-direction. X-translation platform 304 may be about 100 $\mu$m across and 5 to 20 $\mu$m thick. One or both of the platforms 304, 307 is preferably driven by its respective electrostatic comb drives at the mechanical resonance frequency so that translational distances are maximized for a given energy input. The mass of a platform and the material properties and geometry of the flexural support beams can be tailored to achieve a specific resonant frequency. X-translation platform 304 should be of significantly smaller mass than Y-translation platform 307 to ensure that resonant movement of one platform does not create unintended sympathetic resonance with the other platform.

Figure 3C:
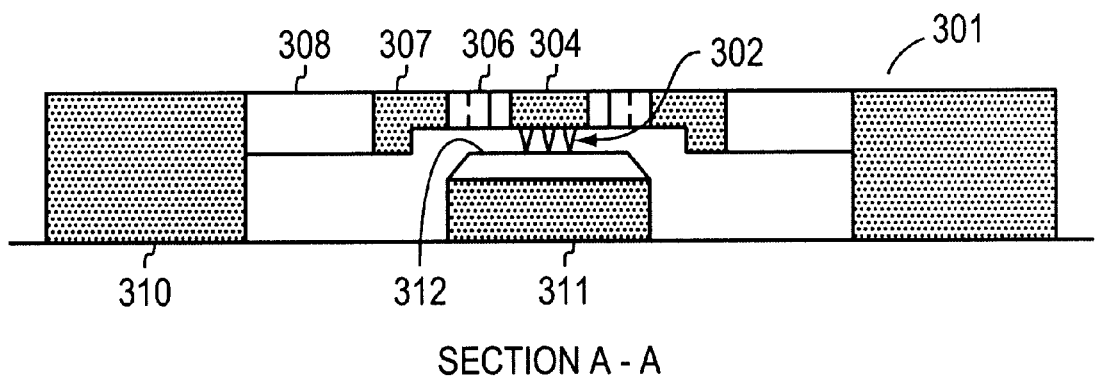
FIG. 3C is a sectional view, taken along the line A—A in FIGS. 3A and 3B, of a stationary memory medium in close proximity to a number of memory read and/or write heads attached to a translating support platform.
Figure 3D:
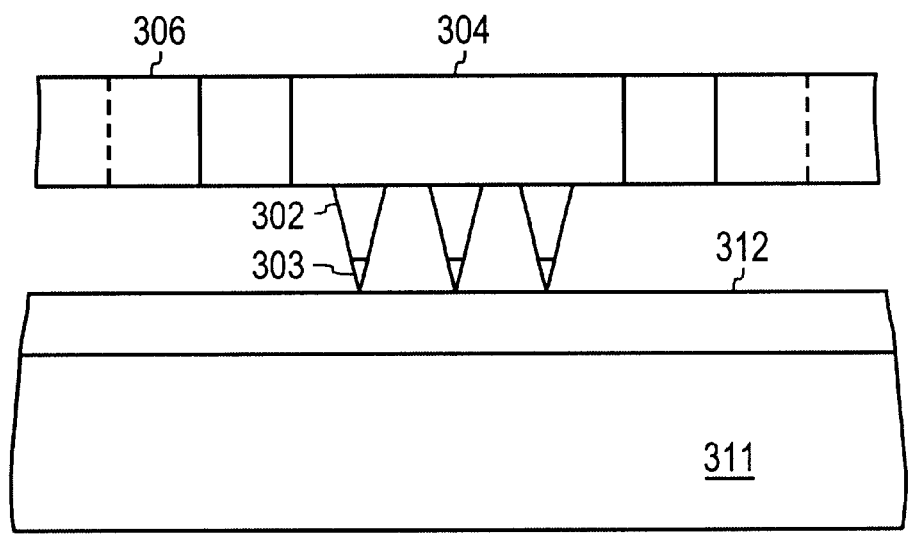
FIG. 3D is a more detailed sectional view of the system shown in FIG. 3C.
Figure 3E:
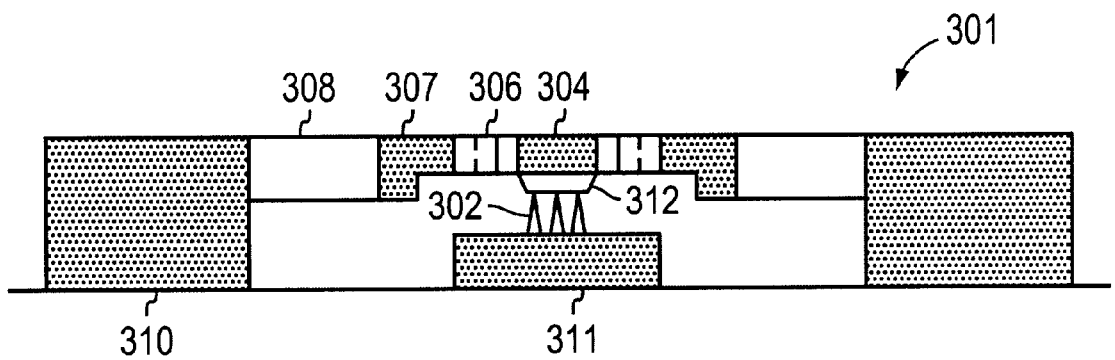
FIGS. 3E and 3F show systems corresponding to those illustrated in FIGS. 3C and 3D, but with the the memory medium rather than the read and/or write heads attached to the translating support platform.
Figure 3F:
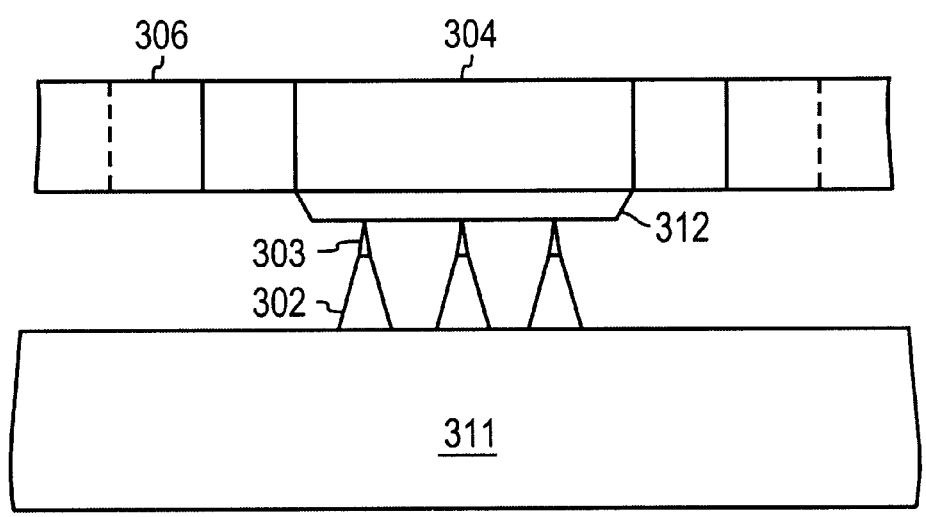

The sectional views shown in FIGS. 3C and 3D depict a series of probes, representatively indicated at 302, each with a read and/or write head 303 attached to the X-translation platform 304. In this particular configuration, the heads 303 move in a plane in close proximity to a stationary memory medium 312 on a fixed support structure 311. Due to the difficulty of implementing reliable data and power transfer to moving heads, however, it is preferable to adopt a configuration whereby memory medium 312 translates, while probes 302 and heads 303 remain attached to fixed support structure 311. Such an alternative configuration is shown in FIGS. 3E and 3F. In either case, the component affixed to support structure 311 (i.e., either the head 303 or the memory medium 312) may be bonded thereto by anodic bonding, wafer bonding, or a combination.

As an example of electromechanical performance, it is anticipated that, with component dimensions as set forth above, comb drives 306 can cause X-translation platform 304 to resonate at about 20 kHz with a maximum peak-to-peak amplitude of about 70 $\mu$m. Assuming that memory medium 312 is patterned with 10-nm bit domains spaced at 40 nm intervals along the X-axis, the upper limit on write and read speeds from a single head are expected to be approximately 35 megabits/sec. With 10 heads operating simultaneously, bit rates can increased by an order of magnitude. Moreover, multiple data storage devices can work in parallel to further increase data transfer rates.

The read/write head element 303 may be a magnetic thin-film head, similar to those found in state-of-the-art magnetic storage devices but significantly reduced in size. Such a head can write to magnetic media by switching the orientation of nanometer-sized magnetic domains. As understood in the art, the same head can also be used to sense the orientation of the magnetic domains during the read operation. Alternatively, read/write head 303 may be a very small ferroelectric head, similar to those found in state-of-the-art ferroelectric storage devices, but significantly reduced in size.

Figure 4A:
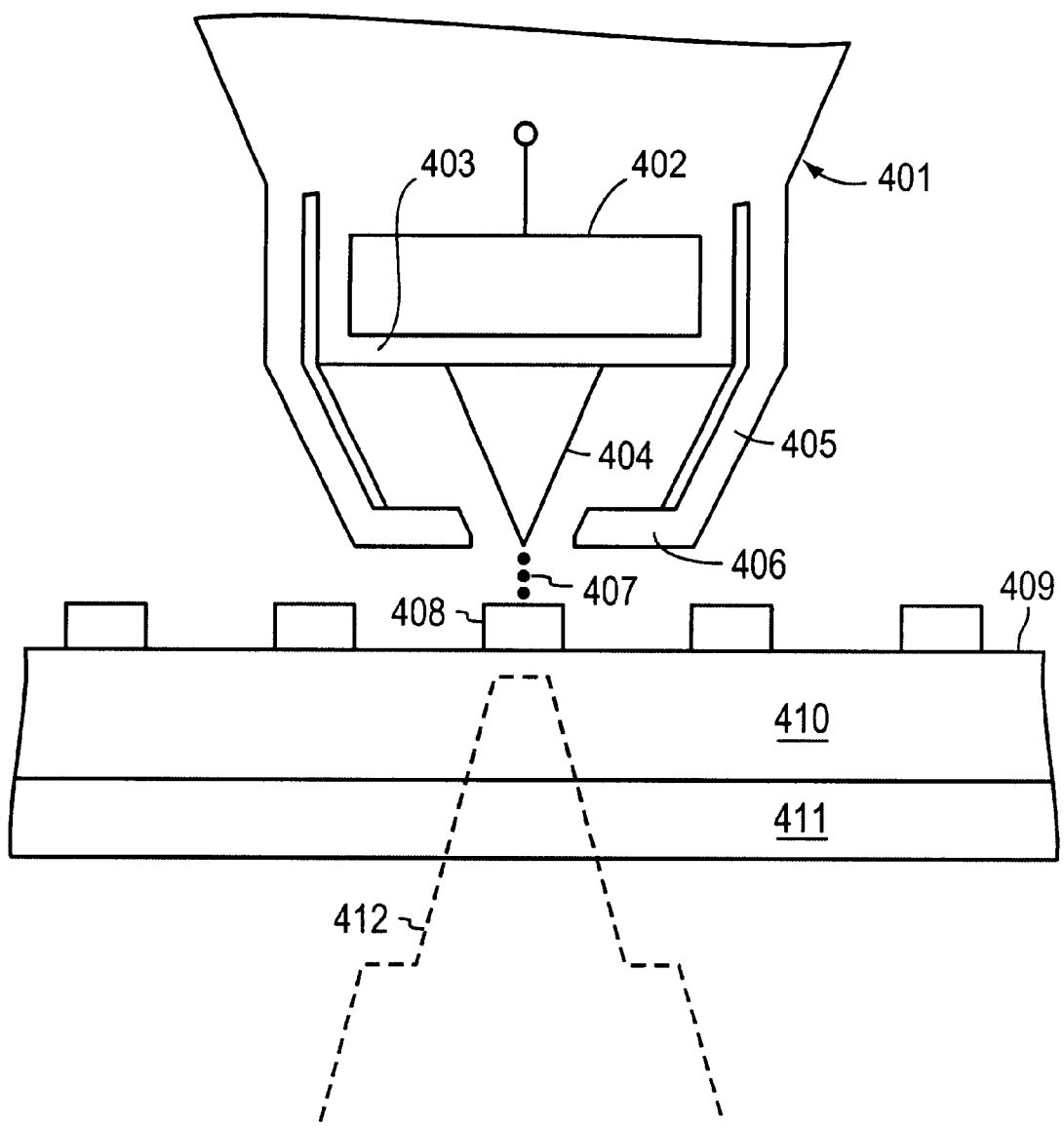
FIG. 4A is a detailed elevational view of a memory write/erase head located at the tip of a memory probe.

In another implementation, shown in FIG. 4A, a write/erase head 401 may be an electron emitter, similar to the emitter tips found in field-emission display back-planes. The head 401 comprises a resistive layer 403 sandwiched between a cathode 402 and an electron emitter tip 404. The memory medium 409 comprises an array of nanometer-sized isolated metallic islands (representatively indicated at 408) patterned onto a first surface of an insulating (e.g., plastic) substrate 410. A conductive anode layer 411 is bonded to the opposite surface of substrate 410. During the writing process, a negative voltage ranging from 5 to 100 volts is applied to cathode 402, while positive voltages of similar magnitudes are applied to a control gate electrode 406 and to anode 411. Cold-cathode emission of electrons, as indicated at 407, is proportional to the voltage difference between cathode 402 and anode 411. The distance between emitter tip 404 and metallic island 408 may, in general, be about 1 nm. However, the insulating layer 410 separating metallic islands 408 and anode layer 411 may be approximately 10 nm thick. This disparity in distances allows the field gradient to favor a net negative charge on metallic islands 408. When in this negatively charged state, a metallic island acts as a storage receptacle for a '1' bit.

In an alternate configuration, anode layer 411 is replaced by an anode tip 412 located directly in line with the electron emission from emitter tip 404. This change enhances field strength and improves the directivity of the electron emission to the metallic island directly below the emitter tip 404, thus reducing the likelihood of writing to the wrong bit domain. This configuration also offer a logistical advantage: if write head 401 and anode tip 412 are held together as a single unit and remain stationary while memory medium 409 is caused to translate between them, the memory medium itself can be a completely passive element requiring no direct electrical connection. As a result, no wiring need traverse the moving parts of a translating support gantry.

Figure 4B:
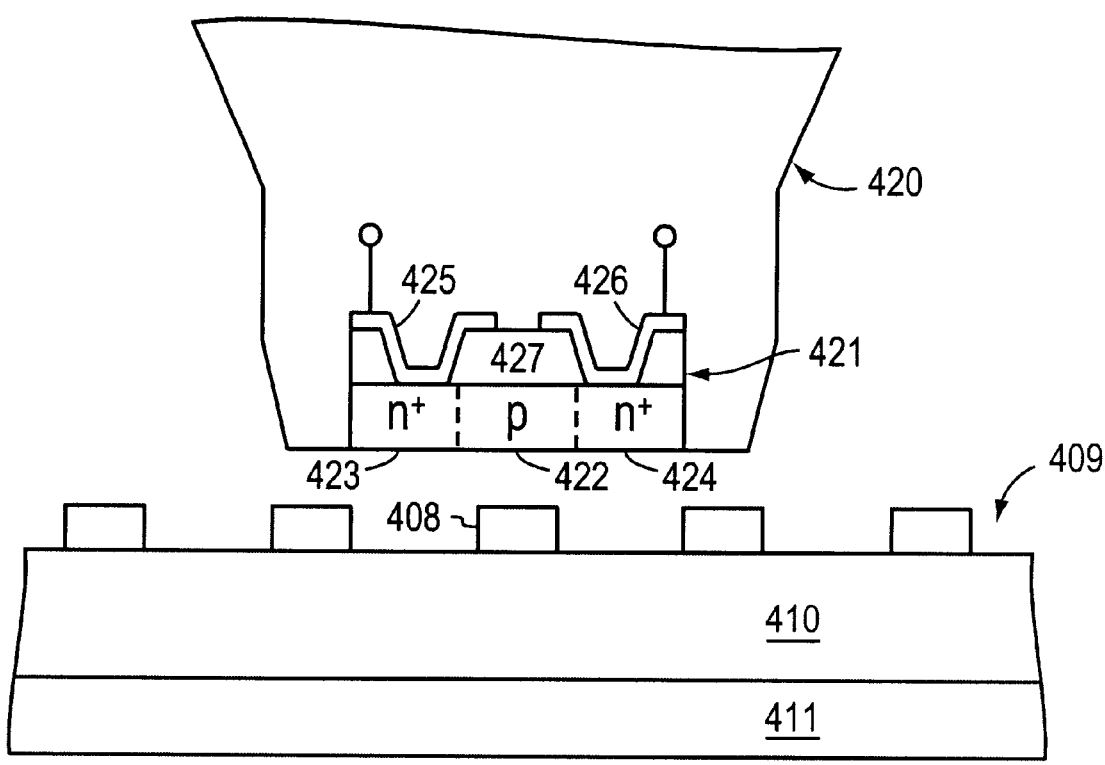
FIG. 4B is a detailed elevational view of a memory read head located at the tip of a memory probe.

In either configuration, bit erasure (or writing of a '0') is accomplished by applying a positive voltage to emitter tip 404 while applying negative voltage to anode layer 411 or anode tip 412. During this process, the affected metallic island 408 obtains a net positive charge. Once binary information has been written to memory medium 409 in the form of negatively and positively charged metallic islands, the information can be extracted from the medium by way of the read head 420 shown in FIG. 4B. Read head 420 is essentially a very small field-effect transistor whose current-voltage characteristics can be altered by faint electric fields emanating from charged metallic islands 408 on the memory medium 409. The construction and operation of the read-head active element 421 is analogous to that of FAMOS (floating-gate avalanche-injection metal-oxide-semiconductor) transistors or FLOTOX (floating-gate tunnel-oxide) transistors typically found in EPROM non-volatile memory chips. A pair of electrodes 425, 426 are attached to an n+ type source 423 and an n+ type drain 424, respectively. The electrodes 425, 426 are separated by an insulating material 427 such as silicon dioxide or silicon nitride. Source and drain elements 423, 424 are separated by a p-type semiconducting channel 422.

During a read operation, the charged metallic island 408 just below the read head 420 acts like a floating gate. A negatively charged metallic island 408 causes a positive shift in the transistor threshold voltage, thereby inducing a detectable decrease in source-drain current. A positively charged metallic island 408 causes a negative shift in the transistor threshold voltage, thereby causing a detectable increase in source-drain current and providing a non-destructive readout of the binary information stored on or in the memory medium 409. Read head is connected to conventional circuitry capable of detecting the increases or decreases in source-drain current during readout events.

Figure 5:
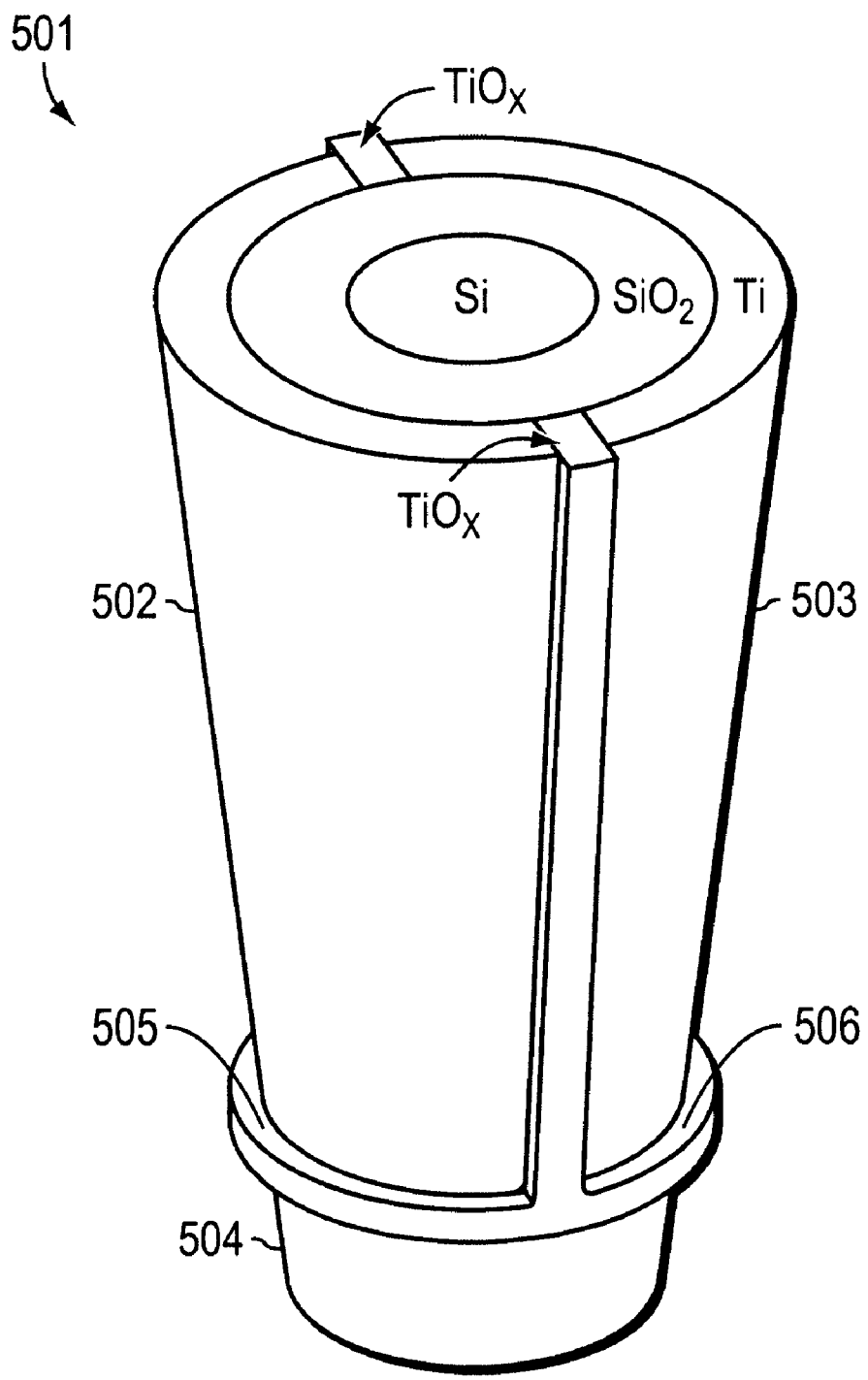
FIG. 5 is an isometric view of a data read head comprising a single electron transistor (SET) positioned at the tip of a data read probe.

In still another implementation, shown in FIG. 5, the illustrated data read head 501 is a single electron transistor (SET) positioned at the tip of a data read probe. The SET comprises a source element 502, a drain element 503, and a conductive island 504. The island 504 is separated from both source 502 and drain 503 by an exceedingly thin insulating barrier which forms a pair of tunnel junctions 505, 506. Typically, source 502, drain 503, and island 504 are fabricated from titanium, while the junctions 505, 506 and barrier are composed of titanium oxide. The tunnel junctions, which are generally about 10 Å thick, break the continuity of electron flow between the source and drain into discrete electron units. The electrostatic energy of a charged island alters electron tunneling rates. With such a SET; a charge as small as of $10^{-3}$ electron in a 10 kHz bandwidth on the island can be detected. Accordingly, a SET (or an array of SETs) may be used to read data from a data-storage medium through detection of the spatial charge field on the surface of the medium.

Figure 6:
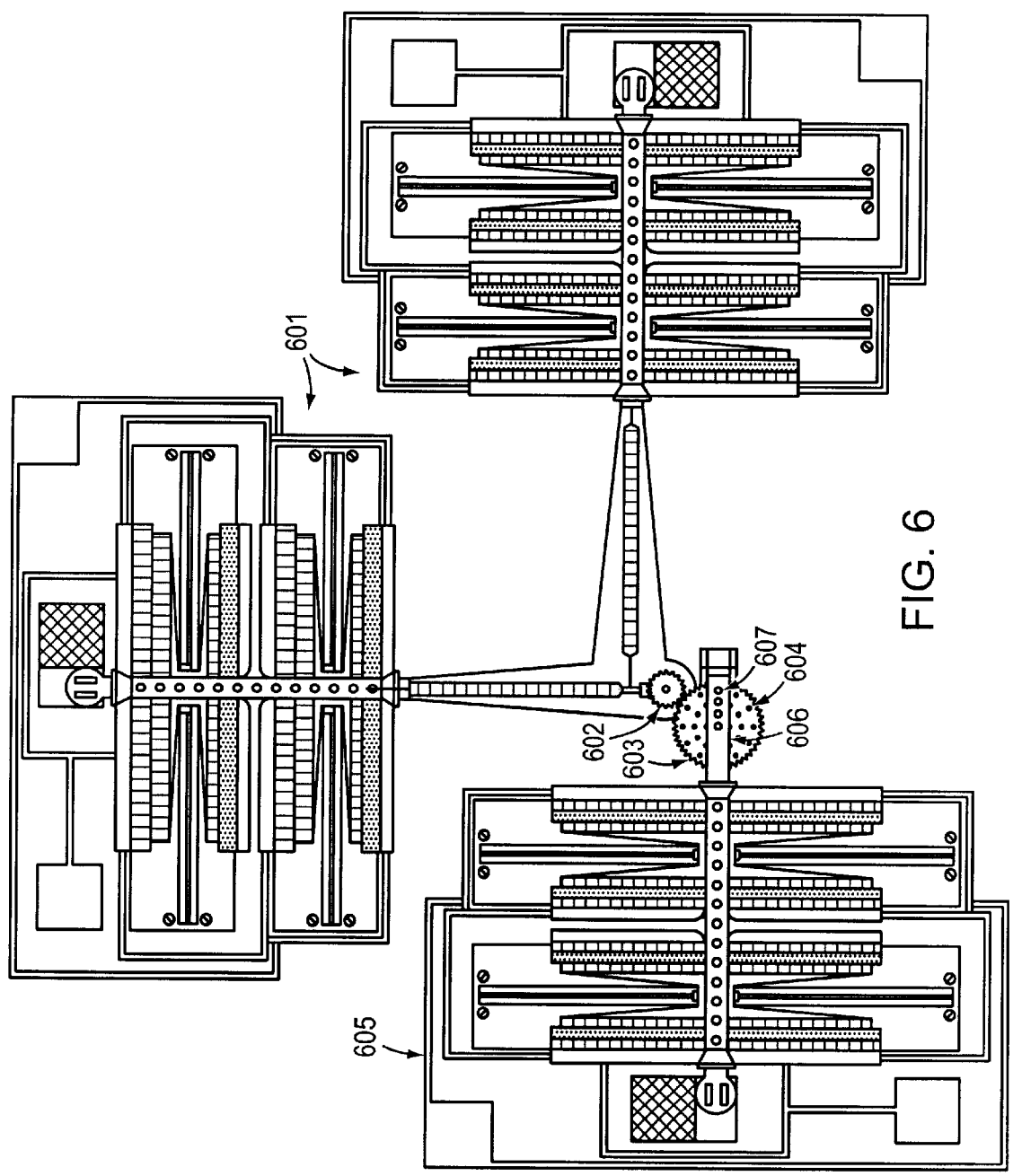
FIG. 6 illustrates an alternative read-write system in accordance with the invention.

It should be stresssed that the microelectromechanical data storage and retrieval structure shown in FIGS. 3A and 3B represents just one of many possible configurations. An alternative configuration, shown in FIG. 6, comprises a microelectromechanical electrostatic comb drive microengine 601 and a small drive gear 602, which cooperate to turn a large gear 603. Large gear 603, in turn, is covered with a memory medium 604. A linear comb drive 605 causes a data read/write head support member 606 to reciprocate over the top of memory medium 604. Support member 606 may support one or a plurality of data read and/or write heads 607 on its underside. The rotary movement of large gear 603 and linear motion of support member 606 cooperate to allow one or more data heads to address substantially all the available area of the memory medium.

Figure 7:
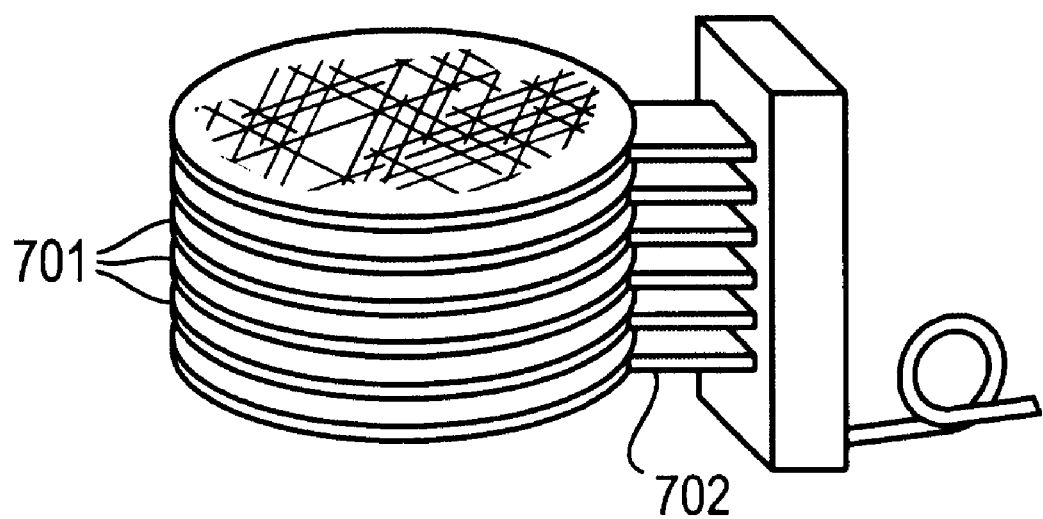
FIG. 7 is an isometric view of a three-dimensional memory unit in accordance with the invention.

Typically, hundreds of microelectromechanical memory devices will be constructed at once on the surface of a single crystal silicon wafer. Before processing, the wafer can be thinned down to approximately 100 $\mu$m without risk that wafer bending will interfere with subsequent processing steps. When processing is complete, the moving memory structures may have a thickness of less than 10 $\mu$m on the surface of the wafer. In addition, it may be possible to assemble memory structures on both sides of a single wafer. As shown in FIG. 7, a series of wafers 701 with data input/output lines 702 can be stacked with air gaps of less than 20 $\mu$m. Such a wafer stack can act as a three-dimensional memory unit with impressive volumetric bit densities. For example, conservatively assuming (1) a bit-domain size of 50 nm, (2) that only 1% of the wafer surface area is devoted to the active memory medium (with the remainder being consumed by electrostatic comb drives, gears, support gantries, data lines, and the like), and (3) that a single wafer with memory structures front and back is 100 $\mu$m thick with a 20-$\mu$m air gap between wafers, the wafer stack would exhibit a volumetric bit density of 66.2 gigabits/$cm^3$ or 1.1 terabits/$in^3$. This wafer stack would also have an areal bit density of 0.4 gigabits/$cm^2$ or 2.6 gigabits/$in^2$.

Using appropriate mechanical algorithms, high-speed bit-shuffling operations can be performed using a storage device in accordance with the present invention to implement a Turing machine. A Turing machine is an abstract, computing device typically described as consisting of a tape that contains a series of '0s' and '1s' that can move to the left or right past a stationary read/write head. In accordance herewith, a planar memory medium populated with bits and mounted upon a moving support structure can function as the tape. Given enough time and bit capacity, the Turing machine follows a table of instructions to compute any function that conventional digital computers can compute. The machine starts in a given state and reads the first bit. According to the table of instructions and the current state of the machine, the machine might: (a) write a 0 or a 1 to the current location; (b) move the memory medium to the left or right or up or down; or (c) obtain a new state as dictated by the table of instructions. The process continues until the table tells the machine to stop.

The table of instructions for a simple Turing machine that can perform unary addition using a read/write head is shown in FIG. 8A. The machine can begin with two groups of '1' bits separated by a single '0' bit on a single row of the memory medium and compose them into a single group of '1' bits. The "State" column refers to the current state of the machine, which is reset after each operation as specified in the "New State" column. "Read" and "Write" operations both pertain to the current memory location. The initial state of the Turing machine must be '0', and the read/write head must begin with the left-most '1' bit in the row of the memory medium. According to one line in the table of instructions in FIG. 8A, if the current state is '2' and a '1' bit is read at the current memory location, a '0' is then written to that location (i.e., the '1' bit is converted to a '0' bit), the head then proceeds to the next memory location to the left, and the new state of the system is then set to '3'. The complete unary addition operation dictated by the instruction set in FIG. 8A is presented in step-by-step form in the table shown in FIG. 8A. The Turing machine read/write head starts with the left-most '1' bit, and then proceeds to convert two groups of '1' bits, each only two '1' bits long, into a single string that is four '1' bits long. The position of the head during the read and write operations is indicated with shaded boxes having highlighted borders.

Figure 9:
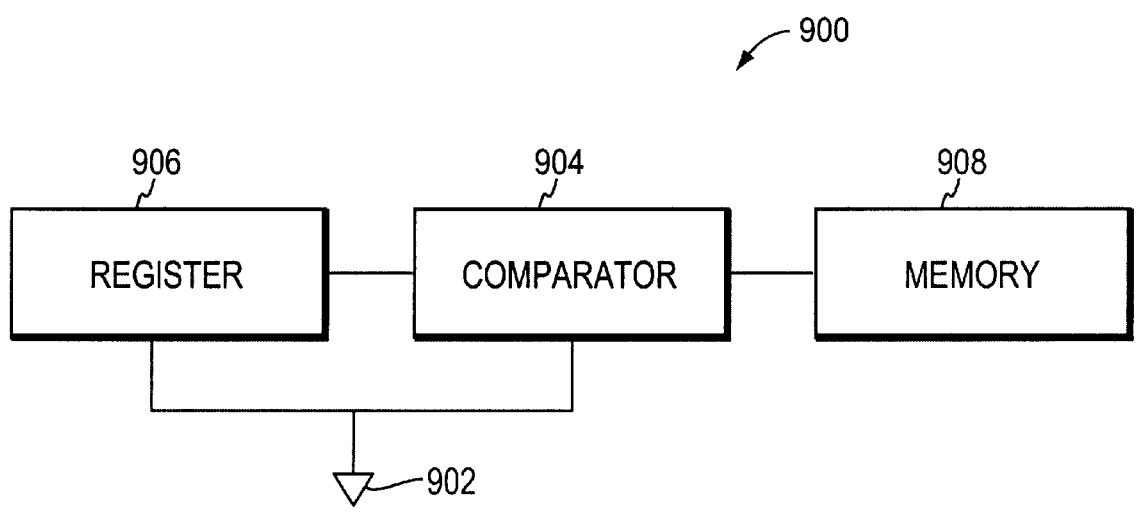
FIG. 9 schematically illustrates a Turing machine in accordance with the invention.

FIG. 9 illustrates simple circuit 900 for implementing a Turing machine in accordance with the present invention. A movable read/write head 902 as described above is connected to a comparator 904, a register 906, and a memory 908. Register 906 maintains the current state of the system, and memory 908 contains the table of instructions relating the current bit, the state of the system, and the action to be taken. In operation, head 902 reads the binary contents of the current location. Based on this value and the the value in register 906, comparator 904 locates the appropriate instruction in the table. Head 902 writes the bit specified in the instruction, which also specifies the new state value written into register 906.

A Turing machine facilitates computation without the need for a processor, and is amenable to more complex operations than those discussed above. For example, a Turing machine may have an instruction table that faciliates decompression of compressed video. The Turing machine simply writes new bits in accordance with the table as the compressed video data is examined, thereby decompressing the data "on the fly."

Although the present invention has been described with reference to specific details, it is not intended that such details should be regarded as limitations upon the scope of the invention, except as and to the extent that they are included in the accompanying claims.

What is claimed is:

1. A memory device comprising:
   a. a data-storage element comprising a support and an array of bit-storage domains arranged on the support, the bit-storage domains being reversibly or irreversibly addressable individually and retaining a readable state upon subjection to an effect-inducing field, the support having a surface comprising an array of pillars projecting therefrom, the bit-storage domains residing atop the pillars and the support being substantially unaffected by the field;
   b. means for directing the field at selected ones of the bit-storage domains; and
   c. means for reading the state of selected ones of the bit-storage domains.

2. A memory device comprising:
   a. a data-storage element comprising a support and an array of bit-storage domains arranged on the support, the domains being insulated from each other by air, the domains being reversibly or irreversibly addressable individually and retaining a readable state upon subjection to an effect-inducing field, the support being substantially unaffected by the field;
   b. means for directing the field at selected ones of the bit-storage domains; and
   c. means for reading the state of selected ones of the bit-storage domains.

3. A memory device comprising:
   a. a data-storage element comprising a support and an array of bit-storage domains arranged on the support, the bit-storage domains comprising capping groups insulating the bit-storage domains from each other, the domains being reversibly or irreversibly addressable individually and retaining a readable state upon subjection to an effect-inducing field, the support being substantially unaffected by the field;
   b. means for directing the field at selected ones of the bit-storage domains; and
   c. means-for reading the state of selected ones of the bit-storage domains.

4. A memory device comprising:
   a. a data-storage element comprising a support and an array of bit-storage domains arranged on the support, the bit-storage domains comprising nanoparticles having side chains that insulate the nanoparticles from each other, the domains being reversibly or irreversibly addressable individually and retaining a readable state upon subjection to an effect-inducing field, the support being substantially unaffected by the field;
   b. means for directing the field at selected ones of the bit-storage domains; and
   c. means for reading the state of selected ones of the bit-storage domains.

5. A memory device comprising:
   a. a data-storage element comprising a support and an array of bit-storage domains arranged on the support, the bit-storage domains being metal-organic compounds exhibiting charge retention, the domains being reversibly or irreversibly addressable individually and retaining a readable state upon subjection to an effect-inducing field, the support being substantially unaffected by the field;
   b. means for directing the field at selected ones of the bit-storage domains; and
   c. means for reading the state of selected ones of the bit-storage domains.

6. The device of claim 5 wherein the metal-organic compounds are coordination complexes comprising a metal atom surrounded by at least one organic ligand.

7. The device of claim 5 wherein the coordination complexes are substantially planar, each bit domain comprising a plurality of stacked coordination complexes.

8. The device of claim 6 wherein the at least one ligand comprises at least one side chain, the side chains of the coordination complexes providing insulation between adjacent bit-storage domains.

9. A memory device comprising:
   a. a data-storage element comprising a support and an array of bit-storage domains arranged on the support, the bit-storage domains being organic or metal-organic compounds exhibiting at least one of (i) different oxidation states and (ii) different structural or conformational states, the domains being reversibly or irreversibly addressable individually and retaining a readable state upon subjection to an effect-inducing field, the support being substantially unaffected by the field;
   b. means for directing the field at selected ones of the bit-storage domains; and
   c. means for reading the state of selected ones of the bit-storage domains.

10. A memory device comprising:
    a. a data-storage element comprising a support and an array of bit-storage domains arranged on the support, the domains being reversibly or irreversibly addressable individually and retaining a readable state upon subjection to an effect-inducing field, the support being substantially unaffected by the field;
    b. means for directing the field at selected ones of the bit-storage domains;
    c. means for reading the state of selected ones of the bit-storage domains; and
    d. means for causing relative movement between (i) the data-storage element and
       (ii) the field-directing means and the reading means, the movement-causing means comprising a positioning gantry, the gantry comprising:
       a. a stationary frame;
       b. first and second translation platforms nested within the frame, the second translation platform being nested within the first translation platform;
       c. a first driver for causing the first translation platform to controllably reciprocate relative to the frame along a first dimension; and
       d. a second driver for causing the second translation platform to reciprocate relative to the first translation platform along a second dimension orthogonal to the first dimension.

11. The device of claim 10 further comprising a stationary support fixed with respect to the frame, the data-storage element being associated with the stationary support and the field-directing means and the reading means being associated with the second platform.

12. The device of claim 11 wherein the data-storage element is bonded to the stationary support by at least one of anodic bonding and wafer bonding.

13. The device of claim 10 further comprising a stationary support fixed with respect to the frame, the field-directing means and the reading means being associated with the stationary support and the data-storage element being associated with the second platform.

14. The device of claim 13 wherein the the field-directing means and the reading means are bonded to the stationary support by at least one of anodic bonding and wafer bonding.

15. The device of claim 10 wherein the frame is rectangular with sides having lengths ranging from 1000 to 3000 $\mu$m.

16. The device of claim 10 wherein the first and second drivers are electrostatic comb drives.

17. A memory device comprising:
    a. a data-storage element comprising a support and an array of individually addressable bit-storage domains on the support, the domains reversibly or irreversibly retaining a readable state upon subjection to an effect-inducing field without affecting the states of adjacent domains, the domains having a size no greater than 50 nm and being spaced apart by a distance no greater than 120 nm, the support having a surface comprising an array of pillars projecting therefrom, the bit-storage domains residing atop the pillars;
    b. means for directing the field at selected ones of the bit-storage domains; and
    c. means for reading the state of selected ones of the bit-storage domains.

18. A memory device comprising:
    a. a data-storage element comprising a support and an array of individually addressable bit-storage domains on the support, the domains reversibly or irreversibly retaining a readable state upon subjection to an effect-inducing field without affecting the states of adjacent domains, the domains having a size no greater than 50 nm and being spaced apart by a distance no greater than 120 nm, the support being a continuous, amorphous film exhibiting reversible, hysteretic switching, the bit-storage domains being arbitrary locations on the film;
    b. means for directing the field at selected ones of the bit-storage domains; and
    c. means for reading the state of selected ones of the bit-storage domains.

19. The device of claim 18 wherein the film comprises a chalcogenide glass capable of non-volatile Ovonic memory switching.

20. The device of claim 18 wherein the film is a metal-oxide memory film.

21. The device of claim 18 wherein the film is a semiconductor-oxide memory film.

22. A memory device comprising:
    a. a data-storage element comprising a support and an array of individually addressable bit-storage domains on the support, the domains reversibly or irreversibly retaining a readable state upon subjection to an effect-inducing field without affecting the states of adjacent domains, the domains having a size no greater than 50 nm and being spaced apart by a distance no greater than 120 nm;
    b. means for directing the field at selected ones of the bit-storage domains;
    c. means for reading the state of selected ones of the bit-storage domains; and
    d. means for causing relative movement between (i) the data-storage element and
       (ii) the field-directing means and the reading means, the movement-causing means comprising a positioning gantry, the gantry comprising:
       a. a stationary frame;
       b. first and second translation platforms nested within the frame, the second translation platform being nested within the first translation platform;
       c. a first driver for causing the first translation platform to controllably reciprocate relative to the frame along a first dimension; and d. a second driver for causing the second translation platform to reciprocate relative to the first translation platform along a second dimension orthogonal to the first dimension.

23. The device of claim 22 further comprising a stationary support fixed with respect to the frame, the data-storage element being associated with the stationary support and the field-directing means and the reading means being associated with the second platform.

24. The device of claim 23 wherein the data-storage element is bonded to the stationary support by at least one of anodic bonding and wafer bonding.

25. The device of claim 22 further comprising a stationary support fixed with respect to the frame, the field-directing means and the reading means being associated with the stationary support and the data-storage element being associated with the second platform.

26. The device of claim 25 wherein the the field-directing means and the reading means are bonded to the stationary support by at least one of anodic bonding and wafer bonding.

27. The device of claim 22 wherein the frame is rectangular with sides having lengths ranging from 1000 to 3000 µm.

28. The device of claim 22 wherein the first and second drivers are electrostatic comb drives.

* * * * *